United States Patent
Popat et al.

[19]

[11] Patent Number: 5,804,990
[45] Date of Patent: Sep. 8, 1998

[54] WIRED COMBINATIONAL LOGIC CIRCUIT WITH PULLUP AND PULLDOWN DEVICES

[75] Inventors: Kaushik Popat, Pleasanton; Bryan Richter, Fremont; Stephen A. Smith, Palo Alto, all of Calif.

[73] Assignee: Cirrus Logic, Inc., Fremont, Calif.

[21] Appl. No.: 633,985

[22] Filed: Apr. 17, 1996

Related U.S. Application Data

[63] Continuation-in-part of Ser. No. 316,151, Sep. 30, 1994, abandoned.

[51] Int. Cl.⁶ .................... H03K 19/094; H03K 19/0175
[52] U.S. Cl. ............................................. 326/114; 326/86
[58] Field of Search ................................ 326/114, 86, 57, 326/30

[56] References Cited

U.S. PATENT DOCUMENTS

| | | | |
|---|---|---|---|
| 4,591,742 | 5/1986 | Morito | 326/86 |
| 5,021,684 | 6/1991 | Ahuja et al. | 326/30 |
| 5,047,673 | 9/1991 | Kaneko | 326/114 |
| 5,153,455 | 10/1992 | Walters, Jr. | 326/114 |
| 5,210,449 | 5/1993 | Nishino et al. | 326/57 |
| 5,285,119 | 2/1994 | Takahashi | 326/57 |

Primary Examiner—Edward P. Westin
Assistant Examiner—Richard Roseen
Attorney, Agent, or Firm—Frank D. Nguyen; J. P. Violette

[57] ABSTRACT

A wired combinational logic arrangement responsive to N binary signal sources includes N circuits, one for each source. The circuits drive a common output terminal. Each circuit includes first and second devices for pulling the common terminal to first and second different voltages during successive abutting activation periods. The first device supplies a current to the common terminal that is considerably greater than the current supplied to the common terminal by the second device. The arrangement further includes a third device for pulling the common terminal to the second voltage at all times. The third device supplies a current to the common terminal that is either equal to or less than the current supplied by the second device.

11 Claims, 6 Drawing Sheets

WIRED COMBINATIONAL LOGIC CIRCUIT WITH PULLUP AND PULLDOWN DEVICES

RELATED APPLICATION

This application is a Continuation-in-part of U.S. patent application Ser. No. 08/316,151, filed Sep. 30, 1994, for "OR CIRCUIT INCLUDING PULLUP AND PULLDOWN DEVICES" now abandoned.

FIELD OF INVENTION

The present invention relates generally to wired logic circuits and more particularly to a combinational logic (i.e., OR and AND) circuit including N networks each having first and second devices for pulling a common output terminal to first and second different voltages during successive abutting time intervals, the first device supplying considerably greater current to the common terminal than the current supplied to the common terminal by the second device.

BACKGROUND ART

Combinational logic circuits such as OR logic circuits and their complement, NOR logic circuits, are commonly used in digital processing of binary signals from plural sources. With respect to an OR logic circuit, in response to any or all of the binary signal sources having a binary value of 1, the OR circuit derives a binary 1 output level. In response to all of the N binary signal sources having a binary 0 level, the OR circuit derives a binary 0 output level. With respect to a NOR logic circuit, on the other hand, in response to any or all of the binary signal sources having a binary value of 1, the NOR circuit derives a binary 0 output. In response to all of the N binary signal sources have a binary 0 level, the NOR circuit derives a binary 1 level. The binary 0 and 1 levels can be respectively represented by high and low voltages or by low and high voltages, depending on the logic set of circuitry. Given the logic states of both OR and NOR logic circuits, an OR logic circuit may be interchangeable with a NOR logic circuit if a simple modification is made, e.g., adding an inverter at the logic circuit output.

Another type of combinational logic circuits is AND logic circuits and their complement, NAND logic circuits. For an AND logic circuit, in response to any or all of the binary signal sources having a binary value of 0, the AND logic circuit derives a binary 0 output level. In response to all of the N binary signal sources having a binary 1 level, the AND circuit derives a binary 1 output level. Conversely, for a NAND logic circuit, in response to any or all of the binary signal sources having a binary value of 0, the NAND logic circuit derives a binary 1 output level. In response to all of the N binary signal sources having a binary 1 level, the NAND circuit derives a 0 output level. Given the logic states of both AND and NAND logic circuits, an AND logic circuit may be interchangeable with a NAND logic circuit if a simple modification is made, e.g., adding an inverter at the logic circuit output.

Moreover, under DeMorgan's theorems:

$$\overline{(A+B)} = \overline{A} * \overline{B}$$

$$\overline{(A*B)} = \overline{A} + \overline{B}$$

In other words, a NOR logic circuit is interchangeable with an AND logic circuit having all of its inputs inverted. Similarly, a NAND logic circuit is interchangeable with an OR logic circuit having all of its inputs inverted. As such, all of the different types of combinational logic circuits can be made interchangeable with simple modifications. It is therefore more convenient to refer to OR, NOR, AND, or NAND logic circuits simply as combinational logic circuits.

One type of combination logic circuits, referred to as a wired circuit, includes pullup and pulldown devices for maintaining an output terminal at voltage levels appropriate for binary 1 and 0 values in accordance with the previously indicated relationship for the wired circuit output and the N binary input signals. The amount of current flowing through the pullup and pulldown devices in the prior art circuits can be substantial, particularly if small resistors are used in pullup or pulldown devices to generate the necessary current for a quick response time.

It is, accordingly, an object of the present invention to provide new and improved wired combinational logic circuits.

A further object of the invention is to provide new and improved low power wired combinational logic circuits wherein transitions at the circuit output terminal occur rapidly in response to transitions at the input of the circuit.

Another object of the invention is to provide new and improved wired combinational circuits having an appropriate compromise between power dissipation and speed of transitions between binary levels at the circuit output.

SUMMARY OF THE INVENTION

In accordance with the present invention, the foregoing objects are achieved by providing an arrangement for coupling N binary input signals from N sources to a common output terminal so a binary signal value at the common output terminal is controlled in accordance with a logical combination of the N binary input signals. The arrangement comprises N circuits, one for each of the N binary input signals, each of the N circuits has an output coupled to the common output terminal and comprises: a first signal generating device receiving as input one of N binary input signals, the first signal generating device generating a first activating signal; a second signal generating device receiving as input the first activating signal, the second signal generating device generating a second activating signal, the second activating signal being activated substantially simultaneously with the first activating signal being deactivated; a first driver receiving the first activating signal as an input and having an output coupled to the common output terminal for supplying a first current to drive the common output terminal signal to a first level; and a second driver receiving the second activating signal as an input and having an output coupled to the common output terminal for supplying a second current smaller than the first current to drive the common output terminal signal to a second level.

The arrangement further comprises a third driver coupled to the common output terminal for supplying a third current to aid the second devices in driving the output terminal signal to the second level; wherein activation periods of the first activating signals of the N circuits occurring at different times.

In accordance with another aspect of the invention, a new and improved method for coupling N binary input signals from N sources to a common output terminal so a binary signal value at the common output terminal is controlled in accordance with a logical combination of the N binary input signals. The method includes the steps of: activating a first driver coupled to the common output terminal to provide a first level output signal; generating a synchronized first set of N activating signals in response to the N binary input signals, the synchronized first set of N activating signals being activated at different times; generating a second set of N activating signals in response to the synchronized first set of N activating signals, each signal of the second set of N activating signals corresponds to a signal of the synchronized first set of N activating signals, the second set of N activating signals becomes activated substantially simultaneously with the corresponding ones of the synchronized first set of N activating signals being deactivated; activating a corresponding second set of drivers coupled to the common output terminal, in response to the first set of N activating signals, to provide a second level output signal, the second set of drivers being more powerful than the first driver; and activating a corresponding third set of drivers coupled to the common output terminal, in response to the second set of N activating signals, to provide the first level output signal, the third set of drivers being less powerful than the second set of drivers.

The above and still further objects, features and advantages of the present invention will become apparent upon consideration of the following detailed description of a specific embodiment thereof, especially when taken in connection with the accompanying drawings.

DESCRIPTION OF THE PREFERRED EMBODIMENT

Figure 3:
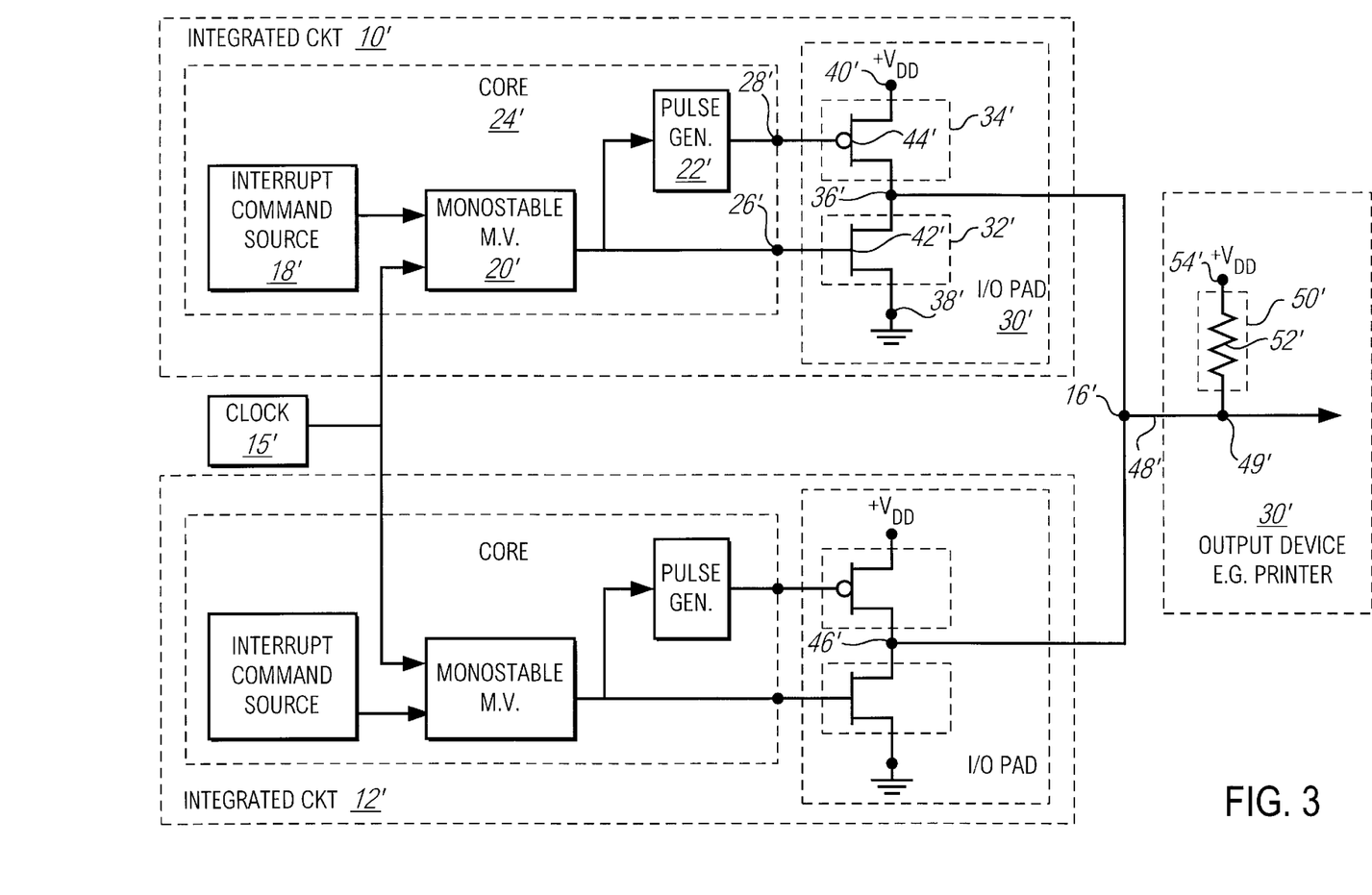
FIG. 3 is a circuit diagram of an embodiment of a NOR circuit in the present invention.

Reference is now made to FIG. 3 wherein an improved wired NOR logic circuit, a preferred embodiment of the present invention, is illustrated. FIG. 3 illustrates integrated circuits 10' and 12' in combination with output device 14' which may be a printer. Circuits 10' and 12' are synchronously driven by a single common clock source 15'. Integrated circuits 10' and 12' are identical so the description of circuit 10' is applicable to circuit 12'. As such, for the sake of brevity and clarity, the description of circuit 12' is hereby omitted. It is to be understood that more than two circuits/networks, similar to circuits 10' and 12', can drive device 14' via common output terminal 16'. Each of the circuits driving common terminal 16' is illustrated as being identical, although it is to be understood that the driving circuits can have different configurations, provided the waveforms supplied by the circuits are the same as described infra for circuits 10' and 12'. It is also to be understood that circuits 10' and 12' need not be integrated circuits but can be any binary signal generating circuits.

Integrated circuit 10' includes core 24' and input/output pad 30'. Core 24' includes interrupt command source 18', monostable multivibrator 20', and pulse generator 22'. Core 24' has first and second output ports 26' and 28' which are connected to the outputs of monostable multivibrator 20' and pulse generator 22' respectively. The signals at output ports 26' and 28' of core 24' are coupled to input/output pad 30'.

When interrupt command source 18' is not activated, source 18' provides a binary output signal of a first value associated with a positive DC voltage. When activated, for example by an appropriate external signal source (not shown), interrupt command source 18' provides a binary output signal of a second value associated with a ground voltage. The output of source 18' can remain at the second value until the external source is deactivated. Alternatively, interrupt command source 18' can respond to the external source by outputting a short duration negative going pulse that quickly goes from the first value to the second value and back to the first value.

Monostable multivibrator 20' receives as inputs the output of interrupt command source 18' and pulses from clock source 15'. Clock source 15' also provides pulses to the corresponding monostable multivibrator of integrated circuit 12'. As a result, the two monostable multivibrators of integrated circuits 10' and 12' are synchronized. In response to short duration variations in the output of interrupt command source 18', monostable multivibrator 20' switches from a relatively low voltage level to a relatively high voltage level. Monostable multivibrator 20' is constructed so that the high voltage level is maintained for a predetermined minimum time interval. If interrupt command source 18' outputs a low voltage output for a time duration exceeding the predetermined minimum time interval, the output of monostable 20' remains at the high voltage level until interrupt command source 18' outputs a high voltage.

Pulse generator 22' receives as input the output of monostable multivibrator 20'. In response to the trailing negative going edge of the monostable output, pulse generator 22' switches its output from a relatively high voltage to a relatively low voltage level. The output of pulse generator 22' remains at the low voltage level for a shorter time interval than the predetermined minimum time interval during which the output of monostable 20' remains high.

Input/output pad 30' includes pulldown and pullup devices 32' and 34' respectively responsive to the voltages at ports 26' and 28' and which comprise a substantial part of the improved wired NOR circuit of the present invention. When pulldown device 32' is enabled, current $i_1'$ is supplied to common terminal 36'. The current supplied by pulldown device 32' to terminal 36' pulls terminal 36' toward the ground voltage supplied at terminal 38' of pulldown device 32'. When pullup device 34' is enabled, current $i_2'$ is supplied to terminal 36' from the positive voltage $V_{DD}$ connected to terminal 40'. Typically, the values of $i_1'$ and $i_2'$ are respectively in the milliampere and microampere levels. Hence, terminal 36' is pulled with much greater "strength" to the ground potential at terminal 38' than it is pulled to the positive potential at terminal 40'.

While pulldown device 32' is an N-channel field effect transistor (FET) 42', pullup device 34' is a P-channel FET 44'. The gates of N-channel FET 42' and P-channel FET 44' are respectively coupled to output ports 26' and 28' of core 24'. The sources of N-channel FET 42' and P-channel FET 44' are connected to ground and voltage $V_{DD}$ respectively. The drains of N-channel FET 42' and P-channel FET 44' are connected together at terminal 36'.

As previously indicated, integrated circuit 12' is identical to integrated circuit 10'. Integrated circuit 12' includes output terminal 46' which corresponds with output terminal 36' of integrated circuit 10'. Output terminals 36' and 46' of integrated circuits 10' and 12' are both connected to common output terminal 16'. Terminal 16' is in turn connected by lead 48' to input terminal 49' of output device 14'.

Output device 14' includes pullup device 50' connected via terminal 49' and lead 48' to common output terminal 16' of integrated circuits 10' and 12'. When neither integrated circuit 10' nor 12' is activated, pullup device 50' maintains terminals 49' and 16' at a binary level associated with a $V_{DD}$ voltage. Pullup device 50' includes resistor 52', connected between the high voltage, $V_{DD}$, at terminal 54' and terminal 49'. Resistor 52' has a relatively large value, that is either equal to or preferably larger than the enabled source-drain resistance of FET 44', causing pullup device 50' to supply a relatively small current, on the order of microamperes, to terminal 49'. Thereby, relatively low power dissipation occurs in pullup device 50'.

In response to a low voltage being supplied to port 26' by monostable multivibrator 20', the source-drain path of N-channel FET 42' is cut-off. Terminal 36' is decoupled from the low ground voltage at terminal 38'. In response to a high voltage being supplied to port 28' by pulse generator 22', the source-drain path of P-channel FET 44' is cut-off. Terminal 36' is decoupled from the high voltage $V_{DD}$ supplied to port 40'. As such, prior to interrupt command source 18' outputting an activating pulse signal, both N-channel FET 42' and P-channel FET 44' are turned off and terminal 16' is maintained at a high voltage by pullup device 50'. Upon the output of an activating pulse signal by interrupt command source 18', FETs 42' and 44' are sequentially enabled in response to the outputs of monostable 20' and pulse generator 22' being at high and low voltages respectively. When enabled, FET 42' supplies considerably greater current from ground terminal 38' to terminal 36' than FET 44' (when enabled) supplied from terminal 40' to terminal 36' because the source drain resistance of enabled FET 42' is considerably smaller than the source drain resistance of enabled FET 44'. Such a result is achieved by proper design of the length to width ratios of the source drain channels of FETS 42' and 44'.

Because the pulldown device of each of integrated circuits 10' and 12' is stronger than the pullup devices of these integrated circuits, the pulldown device has a greater effect on the voltage at output terminal 16' than the pullup device. Hence, in the event of contention between any of the pullup devices of integrated circuits 10' and 12' (i.e., P-channel FET 44' and the corresponding P-channel FET of integrated circuit 12') being enabled and any of the pulldown devices of integrated circuits 10' and 12' (i.e., N-channel FET 42' and the corresponding N-channel FET of integrated 12') being simultaneously enabled, the voltage at terminal 49' will be driven to a relatively low, approximately ground, voltage level quickly.

Terminal 49' can quickly return to the positive voltage level when the N-channel FET 42' of integrated circuit 10' and the corresponding N-channel FET of integrated circuit 12' are both disabled. This is because the P-channel FETs of integrated circuits 10' and 12' are enabled substantially at the same time the N-channel FETs are disabled respectively. The abutting time relationship of the disabling of the N-channel FETs and the enabling of P-channel FETs coupled with pullup circuit 50' causes output terminal 49' to be quickly and positively driven to the high voltage at terminal 54'.

Figure 4A:
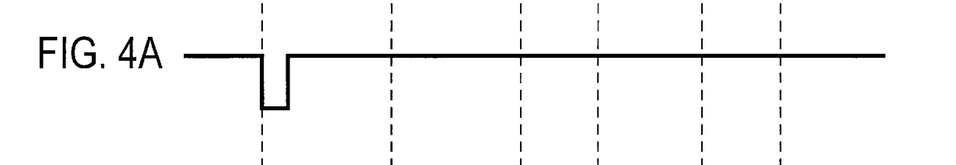
FIG. 4A–4G are waveforms helpful in describing the operation of the circuit of FIG. 3.
Figure 4B:
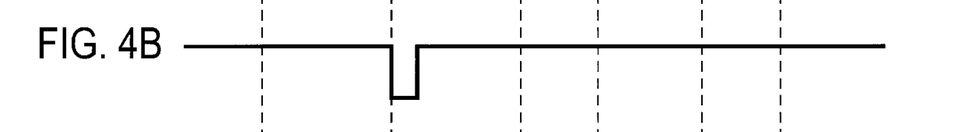
Figure 4C:
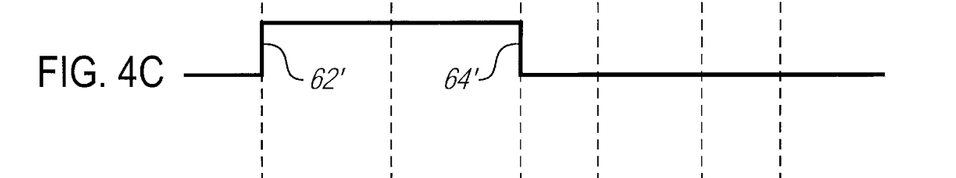

To provide a better understanding of the manner in which the apparatus of FIG. 3 functions, reference is now made to the waveforms of FIG. 4A–4G. In FIG. 4A–4B, the outputs of interrupt command sources of integrated circuits 10' and 12' respectively transition from a high to a low level at times $t_{a'}$, and $t_{b'}$. The transitions to a ground voltage level subsist for only a short time interval, after which the outputs of the interrupt command sources return to the high level. In response to the negative going leading edge of the transition of the output signal waveform provided by interrupt command source 18' of circuit 10' at time $t_{a'}$, monostable multivibrator 20' of integrated circuit 10' is activated causing its output to have a transition from a low level to a high level at time $t_{a'}$, as indicated by positive going edge 62' of FIG. 4C. The output signal of monostable 20' remains at the high level for a predetermined time interval, Tc'. Upon completion of interval Tc', the output of monostable 20' returns to a low voltage, as indicated by negative going transition 64'. During interval Tc', the negative going, leading edge of the output of the interrupt command source of integrated circuit 12' occurs at time $t_{b'}$, FIG. 4B.

Figures 4D, 4E:
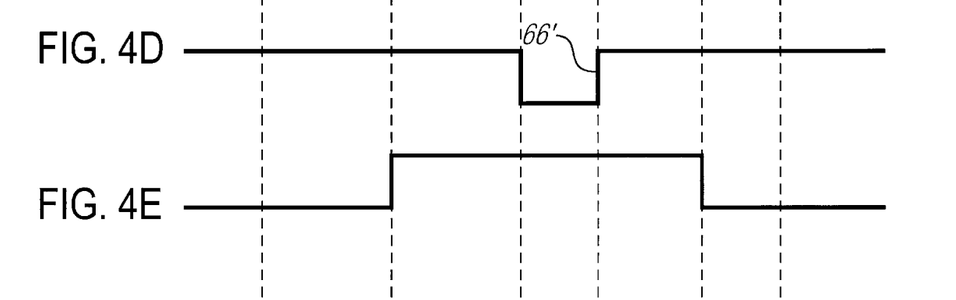
Figure 4F:
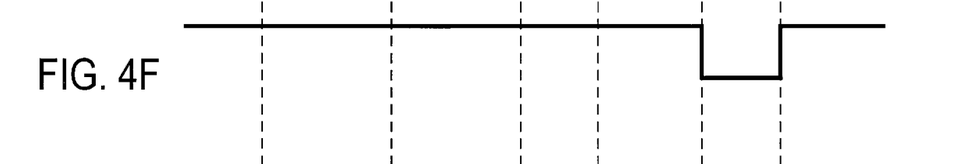

In response to negative going transition 64'of the output of monostable 20', pulse generator 22' of integrated circuit 10' is activated. Upon activation, the output signal of pulse generator 22' transitions from a high to a low level, as indicated by the waveform of FIG. 4D. The output signal of pulse generator 22' remains low for a relatively short duration, $T_{d'}$. Upon the completion of $T_{d'}$, the output of pulse generator 22' has a positive going transition 66' from low to high level.

The low-to-high transition of monostable 20' at time $t_{a'}$ turns on N-channel FET 42' thereby pulling the voltage at terminal 36' down to the ground voltage at terminal 38'. When pulse generator 22' is activated, the high-to-low transition of pulse generator 22' output turns on P-channel FET 44' thereby pulling the voltage at terminal 36' up to the $V_{DD}$ voltage at terminal 40'.

In response to the negative transition of the output signal waveform provided by the interrupt command source of circuit 12' at time $t_{b'}$ in FIG. 4B, the monostable multivibrator of integrated circuit 12' is activated causing its output to have a transition from a low level to a high level at time $t_{b'}$ of FIG. 4E. In response to the negative transition of the output signal waveform provided by the monostable multivibrator of integrated circuit 12' at time $t_{e'}$ in FIG. 4E, the pulse generator of integrated circuit 12' is activated causing its output to have transition from high to low level in FIG. 4F. Given the signal waveforms in FIGS. 4E–4F, the N-channel FET and P-channel FET of integrated circuit 12' operate in the same manner as the corresponding FETs 42' and 44' of integrated circuit 10' which are described earlier.

It is noted from FIGS. 4D and 4E that pullup device 34' of integrated circuit 10' is activated simultaneously with the pulldown device of integrated circuit 12'. Hence, there is contention between the two devices. However, because the pulldown device of integrated circuit 12' is constructed exactly as pulldown device 32' of circuit 10', it is much stronger (i.e., greater current) than pullup device 34' of integrated circuit 10'. As such, the voltage at common output terminal 16' is determined primarily by the strong pulldown device of integrated circuit 12' and remains low.

Figure 4G:
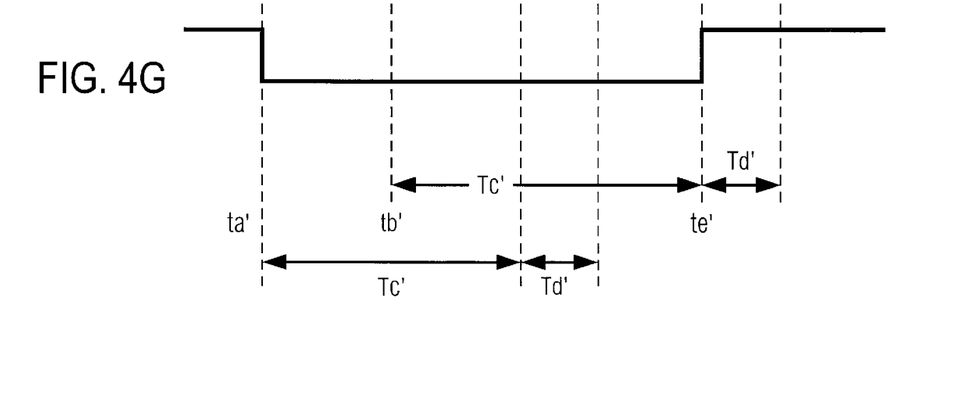

As indicated by the waveform of FIG. 4G, representing the voltage signal at terminals 16' and 49', the output of the wired NOR circuit has a relatively high level, prior to time $t_{a'}$, when the interrupt command sources of circuits 10' and 12' are inactive. The waveform of FIG. 4G has a negative transition, to a relative low level at time $t_{a'}$ and remains at this level until time $t_{e'}$ when there is a negative going transition at the output of the monostable of circuit 12' in FIG. 4E. There is a rapid positive transition in the waveform of FIG. 4G at time $t_{e'}$ because both pulldown devices of integrated circuits 10' and 12' are deactivated and because of the positive current supplied to terminal 16' by the pullup device of circuit 12', the counterpart of pullup device 34' of circuit 10', in combination with the effect provided by pullup device 50'.

Hence, the slow response of some prior art wired NOR circuits in changing from one binary value to a second binary value is prevented. In addition, the power requirements of other such prior art circuits are reduced because the present invention has only one weak pullup device that is always in operation.

Thus, FIGS. 3, 4A–4G illustrate a wired NOR circuit, a preferred embodiment of the invention. On the other hand, Another embodiment of the invention, a wired NAND circuit, is illustrated in FIGS. 5, 6A–6G. The embodiment of FIGS. 5, 6A–6G is similar to its corresponding counterpart in FIGS. 3, 4A–4G and like elements are so indicated by double primed reference numbers. Because of the similarity between the embodiment in 5, 6A–6G and its corresponding counterpart in FIGS. 3, 4A–4G, the structures/elements of the embodiments of FIGS. 5, 6A–6G that are similar and function in a similar fashion as those in FIGS. 3, 4A–4G will not be described in detail again. Rather, only relevant differences between the embodiments will be described.

Figure 5:
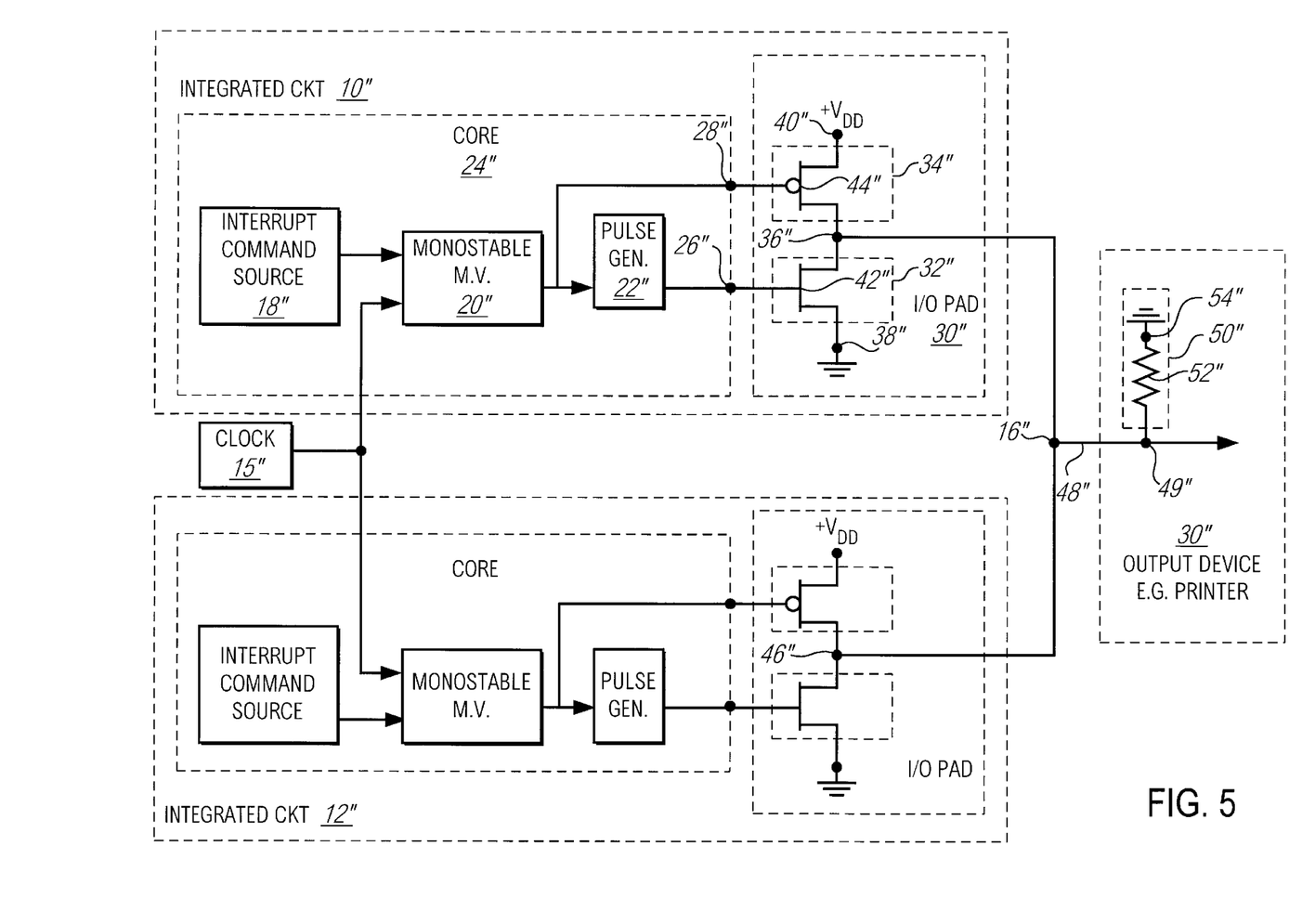
FIG. 5 is a circuit diagram of an embodiment of a NAND circuit in the present invention.

Reference is now made to FIG. 5 wherein an improved wired NAND logic circuit, an alternate embodiment of the present invention, is illustrated. FIG. 5 illustrates integrated circuits 10" and 12" in combination with output device 14" which may be a printer. Circuits 10 and 12" are synchronously driven by a single common clock source 15". Integrated circuits 10" and 12" are identical so the description of circuit 10" is applicable to circuit 12". As such, for the sake of brevity and clarity, the description of circuit 12" is hereby omitted. It is to be understood that more than two circuits/ networks, similar to circuits 10" and 12", can drive device 14" via common output terminal 16". Each of the circuits driving common terminal 16", is illustrated as being identical, although it is to be understood that the driving circuits can have different configurations, provided the waveforms supplied by the circuits are the same as described infra for circuits 10" and 12". It is also to be understood that circuits 10" and 12" need not be integrated circuits but can be any binary signal generating circuits.

Integrated circuit 10" includes core 24" and input/output pad 30". Core 24" includes interrupt command source 18", monostable multivibrator 20" and pulse generator 22". Core 24" has first and second output ports 28" and 26" which are connected to the outputs of monostable multivibrator 20" and pulse generator 22" respectively. The signals at output ports 26" and 28" of core 24" are coupled to input/output pad 30".

The differences between the wired NAND logic circuit illustrated in FIG. 5 and the wired NOR logic circuit illustrated in FIG. 3 are as follows. In the wired NAND logic circuit, the output of monostable multivibrator 20" is connected to terminal 28", the input of P-channel FET 44". In comparison, in the wired NOR logic circuit, the output of monostable multivibrator 20' is connected to terminal 26', the input of N-channel FET 42'. Moreover, in the wired NAND logic circuit, the output of pulse generator 22" is connected to terminal 26", the input of N-channel FET 42". In comparison, in the wire NOR logic circuit, the output of pulse generator 22' is connected to terminal 28', the input of P-channel FET 44'. Additionally, in the wired NAND logic circuit, the resistance of P-channel FET 44" is made much less than that of the N-channel FET 42" which will resulted in a considerably greater current from $V_{DD}$ to terminal 36" when P-channel FET 44" is enabled than the current from ground to terminal 36" when N-channel FET 42" is enabled. As such, the pullup device 34' is much stronger than the pulldown device 32".

When pulldown device 32" is enabled, current $i_1$" is supplied to common terminal 36". The current supplied by pulldown device 32" to terminal 36" pulls terminal 36" toward the ground voltage supplied at terminal 38" of pulldown device 32". When pullup device 34" is enabled, current $i_2$" is supplied to terminal 36" from the positive voltage $V_{DD}$ connected to terminal 40". Typically, the values of $i_1$" and $i_2$" are respectively in the microampere and milliampere levels. Hence, terminal 36" is pulled with much greater "strength" to the positive potential at terminal 40" than it is pulled to the ground potential at terminal 38".

While pulldown device 32" is an N-channel field effect transistor (FET) 42", pullup device 34" is a P-channel FET 44". The gates of N-channel FET 42" and P-channel FET 44" are respectively coupled to output ports 26" and 28" of core 24". The sources of N-channel FET 42" and P-channel FET 44" are connected to ground and voltage $V_{DD}$ respectively. The drains of N-channel FET 42" and P-channel FET 44" are connected together at terminal 36".

As previously indicated, integrated circuit 12" is identical to integrated circuit 10". Integrated circuit 12" includes output terminal 46" which corresponds with output terminal 36" of integrated circuit 10". Output terminals 36" and 46" of integrated circuits 10" and 12" are both connected to common output terminal 16". Terminal 16" is in turn connected by lead 48" to input terminal 49" of output device 14".

Output device 14" includes pulldown device 50" connected via terminal 49" and lead 48" to common output terminal 16" of integrated circuits 10" and 12". When neither integrated circuit 10' nor 12" is activated, pulldown device 50" maintains terminals 49" and 16" at a binary level associated with a ground voltage. Pulldown device 50" includes resistor 52", connected between a ground voltage at terminal 54" and terminal 49". Resistor 52" has a relatively large value, that is either equal to or preferably larger than the enabled source-drain resistance of FET 42", causing pulldown device 50" to supply a relatively small current, on the order of microamperes, to terminal 49". Thereby, relatively low power dissipation occurs in pulldown device 50".

In response to a low voltage being supplied to port 26" by pulse generator 22", the source-drain path of N-channel FET 42" is cut-off. Terminal 36" is decoupled from the low ground voltage at terminal 38". In response to a high voltage being supplied to port 28" by monostable multivibrator 22", the source-drain path of P-channel FET 44" is cut-off. Terminal 36" is decoupled from the high voltage $V_{DD}$ supplied to port 40". As such, prior to interrupt command source 18" outputting an activating pulse signal, both N-channel FET 42" and P-channel FET 44" are turned off and terminal 16" is maintained at a ground voltage by pulldown device 50". Upon the output of an activating pulse signal by interrupt command source 18", FETs 44" and 42" are sequentially enabled in response to the outputs of monostable 20" and pulse generator 22" being at low and high voltages respectively. When enabled, FET 44" supplies considerably greater current from $V_{DD}$ terminal 40" to terminal 36" than FET 42" (when enabled) supplied from terminal 38" to terminal 36" because the source drain resistance of enabled FET 44" is considerably smaller than the source drain resistance of enabled FET 42". Such a result is achieved by proper design of the length to width ratios of the source drain channels of FETS 42" and 44".

Because the pullup device of each of integrated circuits 10" and 12" is stronger than the pulldown devices of these integrated circuits, the pullup device has a greater effect on the voltage at output terminal 16" than the pulldown device. Hence, in the event of contention between any of the pullup devices of integrated circuits 10" and 12" (i.e., P-channel FET 44' and the corresponding P-channel FET of integrated circuit 12") being enabled and any of the pulldown devices of integrated circuits 10" and 12" (i.e., N-channel FET 42" and the corresponding N-channel FET of integrated 12") being simultaneously enabled, the voltage at terminal 49" will be driven to a relatively high voltage level of $V_{DD}$ quickly.

Terminal 49" can quickly return to the ground voltage level when the P-channel FET 44" of integrated circuit 10" and the corresponding P-channel FET of integrated circuit 12" are both disabled. This is because the N-channel FETs of integrated circuits 10" and 12" are enabled substantially at the same time the P-channel FETs are disabled respectively. The abutting time relationship of the disabling of the P-channel FETs and the enabling of N-channel FETs coupled with pulldown circuit 50" causes output terminal 49" a to be quickly driven to ground at terminal 54".

Figure 6A:
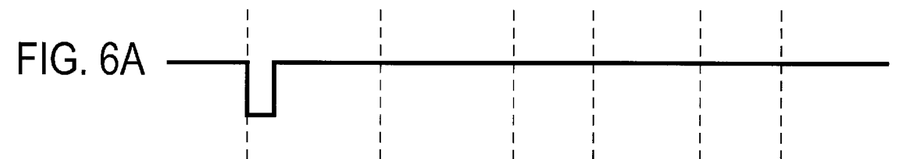
FIG. 6A–6G are waveforms helpful in describing the operation of the circuit of FIG. 5.
Figure 6B:
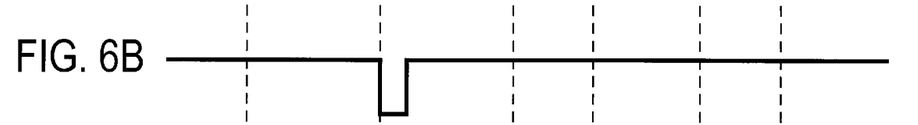
Figure 6C:
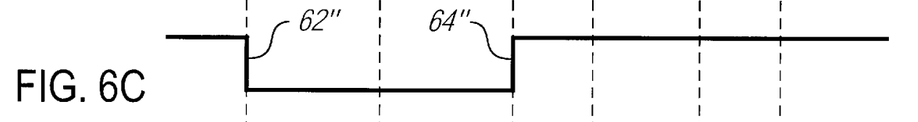

To provide a better understanding of the manner in which the apparatus of FIG. 5 functions, reference is now made to the waveforms of FIG. 6A–6G. In FIG. 6A–6B, the outputs of interrupt command sources of integrated circuits 10" and 12" respectively transition from a high to a low level at times $t_{a''}$ and $t_{b''}$. The transitions to a ground voltage level subsist for only a short time interval, after which the outputs of the interrupt command sources return to the high level. In response to the negative going leading edge of the transition of the output signal waveform provided by interrupt command source 18" of circuit 10" at time $t_{a''}$, monostable multivibrator 20" of integrated circuit 10" is activated causing its output to have a transition from a high level to a low level at time $t_{a''}$, as indicated by negative going edge 62" of FIG. 6C. The output signal of monostable 20" remains at the low level for a predetermined time interval, Tc". Upon completion of interval Tc", the output of monostable 20" returns to a high voltage, as indicated by positive going transition 64". During interval Tc", the negative going, leading edge of the output of the interrupt command source of integrated circuit 12" occurs at time $t_{b''}$, FIG. 6B.

Figure 6D:
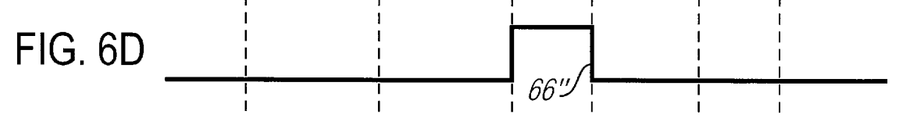

In response to positive going transition 64" of the output of monostable 20", pulse generator 22" of integrated circuit 10" is activated. Upon activation, the output signal of pulse generator 22" transitions from a low to a high level, as illustrated by the waveform of FIG. 6D. The output signal of pulse generator 22" remains high for a relatively short duration, $T_d$". Upon the completion of $T_d$", the output of pulse generator 22" has a negative going transition 66" from high to low level.

The high-to-low transition of monostable 20" at time $t_a$" turns on P-channel FET 44" thereby pulling the voltage at terminal 36" up to the $V_{DD}$ voltage at terminal 40". When pulse generator 22" is activated, the low-to-high transition of pulse generator 22" output turns on N-channel FET 42" thereby pulling the voltage at terminal 36" down to the ground voltage at terminal 38".

Figure 6E:
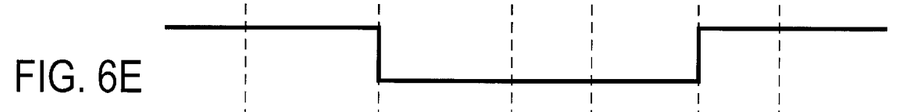
Figure 6F:
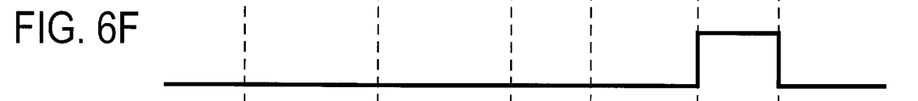

In response to the negative transition of the output signal waveform provided by the interrupt command source of circuit 12" at time $t_{b''}$ in FIG. 6B, the monostable multivibrator of integrated circuit 12" is activated causing its output to have a transition from a high level to a low level at time $t_{b''}$ of FIG. 6E. In response to the positive transition of the output signal waveform provided by the monostable multivibrator of integrated circuit 12" at time $t_{e''}$ in FIG. 6E, the pulse generator of integrated circuit 12" is activated causing its output to have transition from low to high level in FIG. 6F. Given the signal waveforms in FIG. 6E"6F, the N-channel FET and P-channel FET of integrated circuit 12" operate in the same manner as the corresponding FETs 42" and 44" of integrated circuit 10" which are described earlier.

It is noted from FIGS. 6D and 6E that pulldown device 32" of integrated circuit 10" is activated simultaneously with the pullup device of integrated circuit 12". Hence, there is contention between the two devices. However, because the pullup device of integrated circuit 12" is constructed exactly as pullup device 34" of circuit 10", it is much stronger (i.e., greater current) than pulldown device 32" of integrated circuit 10". As such, the voltage at common output terminal 16" is determined primarily by the strong pullup device of integrated circuit 12" and remains high.

Figure 6G:
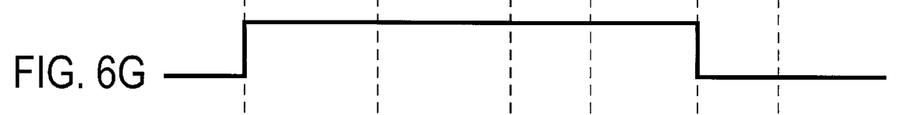

As indicated by the waveform of FIG. 6G, representing the voltage signal at terminals 16" and 49", the output of the wired NAND circuit has a relatively low level, prior to time $t_{a''}$, when the interrupt command sources of circuits 10" and 12" are inactive. The waveform of FIG. 6G has a positive transition, to a relative high level at time $t_{a''}$ and remains at this level until time $t_{e''}$ when there is a positive going transition at the output of the monostable of circuit 12" in FIG. 6E. There is a rapid negative transition in the waveform of FIG. 6G at time $t_{e''}$ a because both pullup devices of integrated circuits 10" and 12" are deactivated and because of the positive current supplied to terminal 16" by the pulldown device of circuit 12", the counterpart of pulldown device 32" of circuit 10", in combination with the effect provided by pulldown device 50".

Hence, the slow response of some prior art wired combinational logic circuits in changing from one binary value to a second binary value is prevented. In addition, the power requirements of other such prior art circuits are reduced because the present invention has only one weak pulldown device that is always in operation.

Thus FIGS. 3, 4A–4G, 5, and 6A–6G illustrate two preferred embodiments of the present invention namely wired NOR and NAND logic circuits including pullup and pulldown devices. As discussed earlier, simple modifications can be made to the NOR and NAND wired logic circuits discussed above to create OR and AND wired logic circuits. For this reason, it should be clear to any person of ordinary skill in the art that all OR, NOR, AND, and NAND wired logic circuits are within the scope of the present invention.

In FIGS. 1 and 2A–2G, a less preferred alternative embodiment of the invention is illustrated which involves a wired OR circuit. This wired OR circuit was disclosed in patent application Ser. No. 08/316,151, filed Sep. 30, 1994, for "OR CIRCUIT INCLUDING PULLUP AND PULL-DOWN DEVICES". The less preferred embodiment of FIGS. 1 and 2A–2G is similar to those of FIGS. 3 and 4A–4G and like reference numerals are employed without primes.

Figure 1:
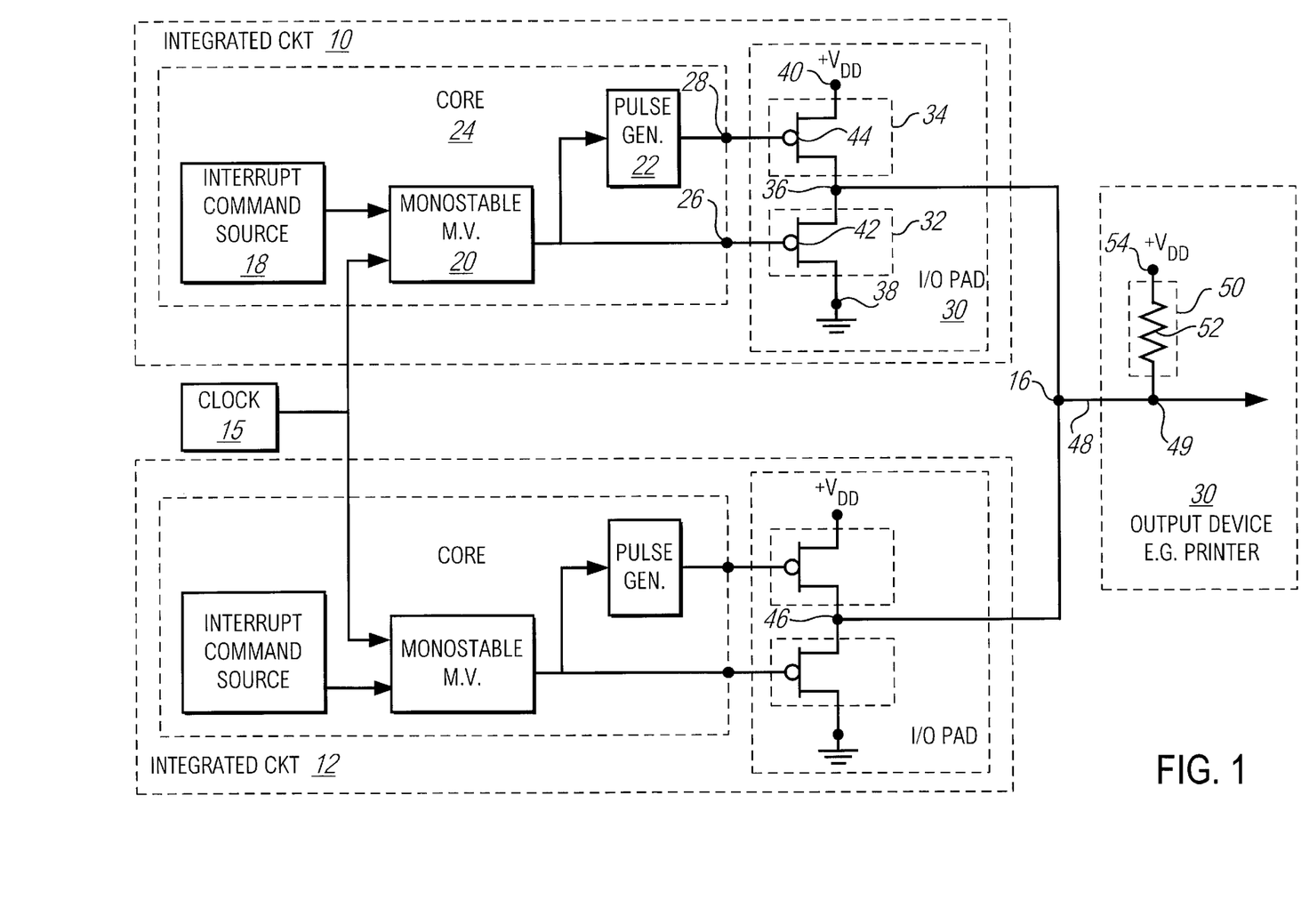
FIG. 1 is a circuit diagram of an embodiment of an OR circuit in the present invention.

Reference is now made to FIG. 1 of the drawings wherein integrated circuits 10 and 12 are illustrated in combination with output device 14, which, for example, is a printer. Circuitry in circuits 10 and 12 is synchronously driven by a single, common clock source 15. Integrated circuits 10 and 12 are identical so the description of circuit 10 is applicable to circuit 12. It is to be understood that more than two circuits, similar to circuits 10 and 12, can drive device 14 via common output terminal 16. Each of the circuits driving common terminal 16 is illustrated as being identical, although it is to be understood that the driving circuits can have different configurations, provided the waveforms supplied by the circuits are the same as described infra for circuits 10 and 12. It is also to be understood that it is not necessary for integrated circuits to drive common terminal 16 but that the terminal can be responsive to any binary signal sources.

Integrated circuit 10 includes interrupt command source 18. Normally, when interrupt command source 18 is not activated, source 18 derives a binary signal having a first value, associated with a positive DC voltage. Interrupt command source 18, when activated, e.g., by an appropriate external signal source (not shown), switches to a second value associated with a zero, i.e. ground, voltage. The output of source 18 can remain at the second value until the external source changes value; alternatively, interrupt command source 18 can respond to the external source by deriving a short duration negative going pulse that quickly goes from the first value to the second value and back to the first value.

The output of interrupt command source 18 which is applied to an input terminal of monostable multivibrator 20, is also responsive to pulses from clock source 15 so transitions of monostable multivibrator 20 are synchronously derived. Monostable multivibrator 20 responds to the output of interrupt command source 18 to switch from a first positive voltage level to a second zero voltage level. Monostable multivibrator 20 is constructed so that the second level is maintained for a predetermined minimum time interval in response to short duration variations in the output of interrupt command source 18. If interrupt command source 18 derives the second value for a time duration exceeding the predetermined minimum time interval, the output of monostable 20 remains at the second level until interrupt command source 18 returns to the first value.

The output of monostable multivibrator 20 is applied to pulse generator 22 which responds to the trailing positive going edge of the monostable output to switch from a first positive voltage amplitude to a second zero voltage amplitude. The output of pulse generator 22 remains at the second amplitude for a shorter time interval than the predetermined minimum time interval derived by the output of monostable 20.

Interrupt command source 18, monostable 20 and pulse generator 22 are included in core 24 of integrated circuit 10. Core 24 includes first and second output ports 26 and 28 which provides the outputs of monostable 20 and pulse generator 22 respectively. The signals at output ports 26 and 28 of core 24 are coupled to input/output pad 30 at the periphery of integrated circuit 10.

Input/output pad 30 includes pulldown and pullup devices 32 and 34 respectively responsive to the voltages at ports 26 and 28 and which comprise a substantial part of the improved wired OR circuit of the present invention. Pulldown and pullup devices 32 and 34 are selectively enabled by the voltages at ports 26 and 28 so that pulldown device 32, when enabled, supplies a relatively high current, i1, to common terminal 36 for pulldown and pullup devices 32 and 34. The current supplied by pulldown device 32 to terminal 36 pulls terminal 36 toward the ground voltage at terminal 38 of pulldown device 32. When enabled, pullup device 34 supplies a lower current, $i_2$, to terminal 36 from the positive DC source, Vdd, connected to terminal 40. Typically, the values of $i_1$ and $i_2$ are respectively in the milliampere and microampere levels. Hence, terminal 36 is pulled with much greater "strength" to the ground potential at terminal 36 than it is pulled to the positive potential at terminal 40.

Pulldown and pullup devices 32 and 34 respectively include field effect transistors 42 and 44 having source drain paths that are normally cut off, i.e., disabled. Field effect transistors 42 and 44 include gate electrodes respectively coupled to output ports 26 and 28 of core 24. In response to positive voltages being supplied to ports 26 and 28 by monostable multivibrator 20 and pulse generator 22, the gate electrodes of field effect transistors 42 and 44 are biased so the source drain paths of the FETs are cutoff, so terminal 36 is decoupled from the voltages at terminals 38 and 40 and no appreciable current is supplied by terminal 36 to common output terminal 16. Thereby, in response to interrupt command source 18 being at the first value, prior to the interrupt signal switching to the second value, integrated circuit 10 does not supply current to common terminal 16. The source drain paths of FETs 42 and 44 are respectively enabled to the relatively low impedance state in response to the outputs of monostable 20 and pulse generator 22 being at low, ground levels. When enabled, FET 42 supplies considerably greater current from ground terminal 38 to terminal 36 than FET 44 (when enabled) supplied from terminal 40 to terminal 36 because the source drain resistance of enabled FET 42 is considerably smaller than the source drain resistance of enabled FET 44. Such a result is achieved by proper design of the length to width ratios of the source drain channels of FETS 42 and 44.

As previously indicated, integrated circuit 12 is identical to integrated circuit 10. Integrated circuit 12 includes output terminal 46 which corresponds with output terminal 36 of integrated circuit 10. Output terminals 36 and 46 of integrated circuits 10 and 12 are both connected to common output terminal 16, in turn connected by lead 48 to input terminal 49 of output device 14.

Output device 14 includes pullup device 50 connected in DC circuit via terminal 49 and lead 48 to common output terminal 16 of integrated circuits 10 and 12. Pullup device 50 maintains terminals 49 and 16 at a binary level associated with a positive DC voltage, when neither of integrated circuits 10 or 12 is supplying current to terminal 16 via terminal 36 and FET 42 or terminal 46 and the FET in circuit 12 corresponding to FET 42. To this end, pullup device 50 includes resistor 52, connected between the positive DC voltage, $V_{DD}$, at terminal 54 and terminal 49. Resistor 52 has a relatively high value, commensurate with the enabled source-drain resistance of FET 44, causing pullup device 50 to supply a relatively low current, on the order of microamperes, to terminal 49. Thereby, relatively low power dissipation occurs in pullup device 50 and the voltage at terminal 49 is driven to a relatively low, approximately ground, level quickly in response to pulldown device 32 of integrated circuit 10 or the corresponding pulldown device of integrated circuit 12 being enabled. Terminal 49 can quickly return to the binary 1 level when the source-drain path of FET 42 and the corresponding FET of integrated circuit 12 are both disabled. This is because FET 44 is driven to an enabled state by the output of pulse generator 22 simultaneously with FET 42 being driven to a disabled state by the output of monostable 20. The abutting time relationship of the cutoff of FET 42 and the enabling of FET 44 cause output terminal 49 to be quickly and positively driven to the positive voltage at terminal 54 associated with a binary 1 level.

Because the pulldown device of each of integrated circuits 10 and 12 is stronger than the pullup devices of these integrated circuits, the pulldown device has a greater effect on the voltage at output terminal 16 than the pullup device. Hence, if pulldown device 42 of integrated circuit 10 is simultaneously activated with the pullup device of circuit 10, or vice versa, the voltage at terminal 16 is at a low voltage level associated with a binary zero value.

Figure 2A:
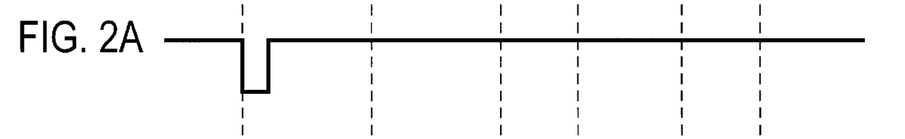
FIG. 2A–2G are waveforms helpful in describing the operation of the circuit of FIG. 1.
Figure 2B:
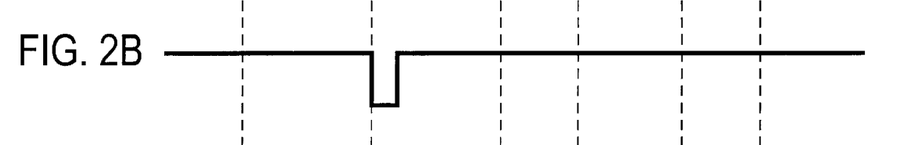
Figure 2C:
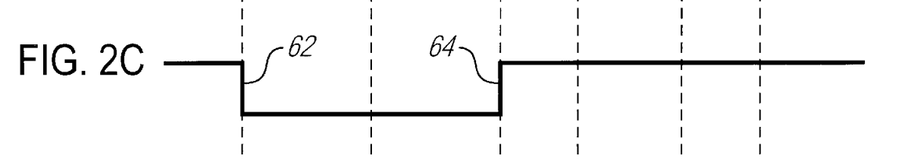

To provide a better understanding of the manner in which the apparatus of FIG. 1 functions, reference is now made to the waveforms of FIG. 2A–2G. In FIG. 2A–2G, it is assumed that the interrupt command sources of integrated circuits 10 and 12 respectively have transitions from the first, normal value thereof, at positive DC levels, to the second value, associated with a ground voltage, at times ta and $t_b$ as illustrated in FIGS. 2A and 2B. The transitions to the second values of the waveforms of FIGS. 2A and 2B subsist for only a short time interval, after which the outputs of the interrupt command source return to the normal first values. In response to the negative going leading edge of the transition of the waveform derived by the interrupt command source of circuit 10 which occurs at time $t_a$, monostable multivibrator 20 of integrated circuit 10 is activated so the amplitude of the monostable output has a transition from a positive DC level to a ground level at time $t_a$, as indicated by negative going edge 62 of FIG. 2C. The output of monostable 20 of integrated circuit 10 remains at the ground level for a predetermined time interval, Tc. Upon completion of interval Tc, the output of monostable 20 returns to a positive voltage, as indicated by positive going transition 64, FIG. 2C. During interval Tc, the negative going, leading edge of the output of the interrupt command source of integrated circuit 12 occurs at time $t_b$.

Figure 2D:
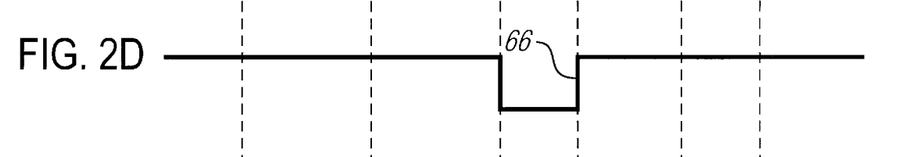

In response to positive going transition 64 at the output of monostable 20, pulse generator 22 of integrated circuit 10 is activated so the output thereof has a transition from a first amplitude to a second amplitude, as indicated by the waveform of FIG. 2D. The first and second amplitudes of FIG. 2D are respectively associated with positive and ground voltages. Pulse generator 22 derives the second, ground amplitude for a relatively short duration, $T_d$. Upon the completion of $T_d$, the output of pulse generator 22 has a positive going transition 66 from the second, ground amplitude to the first, positive voltage amplitude. During interval $T_c$, the source-drain path of FET 42 is enabled, causing a relatively high current to be coupled from ground terminal 38 to terminal 36; the current supplied by FET 42 from terminal 38 to terminal 36 during this interval has a waveform similar to the waveform of FIG. 2C. During interval $T_d$, the source drain path of FET 44 is enabled, causing positive current to flow from terminal 40 to terminal 36 so terminal 36 quickly returns from the ground voltage at terminal 38 to the positive voltage at terminal 40. However, the current flow from terminal 40 through FET 44 to terminal 36 is considerably less than the current flow between terminals 36 and 38 while FET 42 is enabled.

Figure 2E:
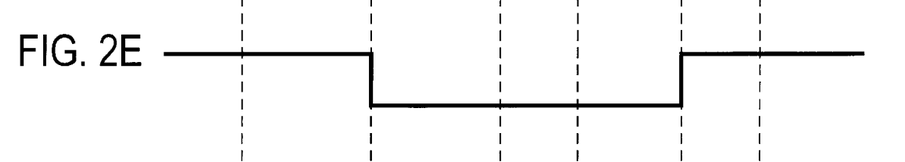
Figure 2F:
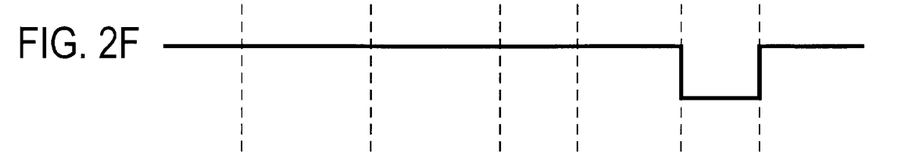

In response to the negative transition at time tb of the waveform of FIG. 2B, the output of the monostable of integrated circuit 12 corresponding with monostable 20 has a transition from a first, positive level to a ground level, as indicated by the waveform of FIG. 2E. The pulse generator of integrated circuit 12 corresponding with pulse generator 22 of integrated circuit 10 derives the waveform of FIG. 2F in response to the positive going transition of the waveform of FIG. 2E. Thereby, the FETs of integrated circuit 12 corresponding with FETs 42 and 44 of integrated circuit 10 are operated in response to the interrupt pulse of FIG. 2B in the same manner that the FETs of integrated circuit 10 are operated in response to the negative going transition of FIG. 2A.

It is noted from FIGS. 2D and 2E that pullup device 34 of integrated circuit 10 is enabled simultaneously with the pulldown device of integrated circuit 12 corresponding with pulldown device 32 of integrated circuit 10. Hence, there is a tendency for positive current to flow from terminal 40 to terminal 16 via terminal 36 while the pulldown device of integrated circuit 12 corresponding with pulldown device 32 of integrated circuit 10 is enabled. However, because the pulldown device of integrated circuit 12 is much stronger than pullup device 34 of integrated circuit 10, due to the lower enabled source-drain resistance of the FET corresponding with FET 42 than that of the enabled FET 34 and the greater current flowing through the enabled pulldown device than through the enabled pullup device, the voltage at common output terminal 16 is determined primarily by the strong pulldown device of integrated circuit 12. The voltage at common terminal 16 during interval $T_d$ is thus governed by the voltage at terminal 46 rather than the voltage at terminal 36, causing a low voltage, associated with a binary 0, to be coupled to input terminal 49 of output device 14.

Figure 2G:
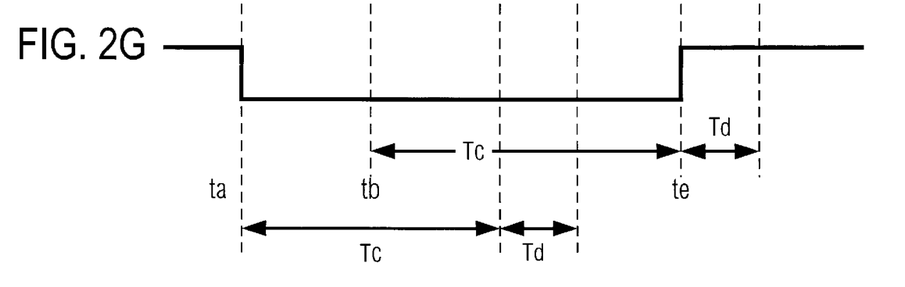

As indicated by the waveform of FIG. 2G, representing the voltage at terminals 16 and 49, the output of the wired OR circuit has a positive level, associated with a binary one value, prior to time $t_a$, when the interrupt command sources of circuits 10 and 12 are inactive. The voltage indicated by the waveform of FIG. 2G has a negative transition, to a level associated with a binary zero value, at time $t_a$ and stays at this level until time $t_e$ when there is a positive going transition at the output of the monostable of circuit 12. There is a rapid transition in the waveform of FIG. 2G at time $t_e$ because of the positive current supplied to terminal 16 by the pullup device of circuit 12 corresponding to pullup device 34 of circuit 10, in combination with the effect provided by pullup device 50. Hence, the tendency of some prior art wired OR circuits to gradually change from one binary value to a second binary value is overcome. In addition, the power requirements of other such prior art circuits are reduced because the present invention uses only one weak pullup device that is always in operation.

While there has been described and illustrated two specific embodiments of the invention, it will be clear that variations in the details of the embodiments specifically illustrated and described may be made without departing from the true spirit and scope of the invention as defined in the appended claims. For example, the logic notation can be reversed so zero and high voltage levels can be respectively associated with zero and binary one levels. Or, a NOR logic circuit can be modified into an OR logic circuit and vice versa.

We claim:

1. An arrangement for coupling N binary input signals from N sources to a common output terminal so a binary signal value at the common output terminal is controlled in accordance with a logical combination of the N binary input signals, comprising:

N circuits, one for each of the N binary input signals, each of the N circuits having an output coupled to the common output terminal and comprising:

a first signal generating device receiving as input one of N binary input signals, the first signal generating device generating a first activating signal;

a second signal generating device receiving as input the first activating signal, the second signal generating device generating a second activating signal, the second activating signal being activated substantially simultaneously with the first activating signal being deactivated;

a first driver receiving the first activating signal as an input and having an output coupled to the common output terminal for supplying a first current to drive the common output terminal signal to a first level; and a second driver receiving the second activating signal as an input and having an output coupled to the common output terminal for supplying a second current smaller than the first current to drive the common output terminal signal to a second level;

the arrangement further comprising a third driver coupled to the common output terminal for supplying a third current to aid the second drivers in driving the output terminal signal to the second level; wherein activation periods of the first activating signals of the N circuits begin at different times.

2. The arrangement of claim 1, wherein the third current of the third driver is equal to or smaller than the second current of the second driver of each of the N circuits.

3. The arrangement of claim 1, wherein the first signal generating devices of the N circuits are synchronized by a clock device.

4. The arrangement of claim 1, wherein the first signal generating devices of the N circuits are monostable multivibrators.

5. The arrangement of claim 1, wherein the second signal generating devices of the N circuits are pulse generators.

6. The arrangement of claim 1, wherein the second drivers of the N circuits are P-channel field-effect-transistors each having a source, a gate, and a drain; the sources of the P-channel field-effect-transistors being connected to a high voltage source, the gates of the P-channel field-effect-transistors being the input of the second drivers; wherein the first drivers of the N circuits are N-channel field-effect-transistors each having a source, a gate, and a drain; the sources of the N-channel field-effect-transistors connected to a low voltage source, the gates of the N-channel field-effect-transistors being the input of the first drivers, and the drains of the N-channel field-effect-transistors and the drains of the P-channel field-effect-transistors are connected together to form the arrangement common output terminal.

7. The arrangement of claim 6, wherein the third driver is a resistor connected between a high voltage source and the arrangement common output terminal.

8. The arrangement of claim 1, wherein the second drivers of the N circuits are N-channel field-effect-transistors each having a source, a gate, and a drain; the sources of the N-channel field-effect-transistors being connected to a low voltage source, the gates of the N-channel field-effect-transistors being the input of the second drivers; wherein the first drivers of the N circuits are P-channel field-effect-transistors each having a source, a gate, and a drain; the sources of the P-channel field-effect-transistors connected to a high voltage source, the gates of the P-channel field-effect-transistors being the input of the first drivers, and the drains of the P-channel field-effect-transistors and the drains of the N-channel field-effect-transistors are connected together to form the arrangement common output terminal.

9. The arrangement of claim 8, wherein the third driver is a resistor connected between a low voltage source and the arrangement common output terminal.

10. A method for coupling N binary input signals from N sources to a common output terminal so a binary signal value at the common output terminal is controlled in accordance with a logical NOR combination of the N binary input signals, comprising:

activating a first driver coupled to the common output terminal to provide a first level output signal;

generating a synchronized first set of N activating signals in response to the N binary input signals, the synchronized first set of N activating signals being activated at different times; and generating a second set of N activating signals in response to the synchronized first set of N activating signals, each signal of the second set of N activating signals corresponds to a signal of the synchronized first set of N activating signals, the second set of N activating signals becomes activated substantially simultaneously with the corresponding ones of the synchronized first set of N activating signals being deactivated;

activating a corresponding second set of drivers coupled to the common output terminal, in response to the first set of N activating signals, to provide a second level output signal, the second set of drivers being more powerful than the first driver; and activating a corresponding third set of drivers coupled to the common output terminal, in response to the second set of N activating signals, to provide the first level output signal, the third set of drivers being less powerful than the second set of drivers.

11. The method of claim 8 further comprising the step of synchronizing the first set of N activating signals in activating the second set of drivers.

* * * * *